United States Patent

[11] 3,588,886

[72] Inventor Harold G. Lee
Portland, Oreg.
[21] Appl. No. 814,112
[22] Filed Apr. 7, 1969
[45] Patented June 28, 1971
[73] Assignee Leupold & Stevens Instruments, Inc.
Beaverton, Oreg.

[54] SHAFT ENCODER HAVING TAPE PUNCH AND SWITCH READOUT MEANS ACTUATED ON TWO DIFFERENT PORTIONS OF SAME ENCODER CAM
14 Claims, 6 Drawing Figs.

[52] U.S. Cl. .... 340/347, 235/92, 346/72
[51] Int. Cl. .... H03k 13/02, G08c 9/00
[50] Field of Search .... 235/133, 134, 92, 154, 61.112; 340/347

[56] References Cited

UNITED STATES PATENTS 3,147,470 9/1964 Bell et al. .... 235/154X
3,275,807 9/1966 Harper .... 340/347
3,416,151 12/1968 Adler .... 340/347
3,465,328 9/1969 Gilb .... 340/347X

*Primary Examiner*—Daryl W. Cook
*Assistant Examiner*—Gary R. Edwards
*Attorney*—Buckhorn, Blore, Klarquist and Sparkman

ABSTRACT: A shaft encoder apparatus is described in which two readout means, such as tape punch and telemetering switch, are actuated by engagement with two different portions of the same encoder cams displaced by an angle of 90°. The encoder cams are arranged in groups to form a binary coded decimal counter with each group of cams corresponding to a different digit of the counter reading. Adjacent cam groups are coupled together through transfer gears which are vibrated during the readout operation to move the counter cams into an unambiguous counter reading immediately prior to locking the counter so that a counter reading can be taken by the readout means.

HAROLD G. LEE
*INVENTOR*

*BY*

*BUCKHORN, BLORE, KLARQUIST & SPARKMAN*
*ATTORNEYS*

HAROLD G. LEE
*INVENTOR*

*BY*

*BUCKHORN, BLORE, KLARQUIST & SPARKMAN*
*ATTORNEYS*

HAROLD G. LEE
*INVENTOR*

*BY*

*BUCKHORN, BLORE, KLARQUIST & SPARKMAN*
*ATTORNEYS*

SHAFT ENCODER HAVING TAPE PUNCH AND SWITCH READOUT MEANS ACTUATED ON TWO DIFFERENT PORTIONS OF SAME ENCODER CAM

BACKGROUND OF THE INVENTION

The subject matter of the present invention relates generally to shaft encoders employing digitally coded cams to provide a counter which indicates the rotational position of the input shaft, and in particular to such a shaft encoder employing two readout means such as tape punches, telemetering switches and the like to take a counter reading by direct engagement with two different portions of the same counter cams.

The shaft encoder apparatus of the present invention is an improvement over the earlier encoder apparatus shown in copending U.S. Pat. application Ser. No. 719,464 of Harold G. Lee, filed Apr. 8, 1968. The present apparatus is simpler and more compact than such previous encoder apparatus since the tape punch and the telemetering switch readout means are both actuated by direct engagement with the counter cams, and such switch is not operated by engagement with a special punch actuator as in the previous apparatus. Thus the tape punch and telemetering switch are operated independently to engage different portions of the same counter cams at two readout positions displaced from each other by an angle of about 90°. Each counter cam is provided with two sets of binary coded cam surfaces to provide two decimal counter readings of identical values at these two counter readout positions.

The shaft encoder apparatus of the present invention is also more accurate and less subject to jamming, since it employs a jitter means during readout for vibrating the transfer gears coupling adjacent stages of counter cams together, so that such counter cams are vibrated into their closest readout positions, thereby providing an unambiguous counter reading before they are locked to prevent rotation of the cams during the time the readout means engages such cams to record such reading. In addition, the encoder apparatus of the present invention is more versatile than conventional apparatus such as U.S. Pat. No. 3,427,632 of Vahs et al. having only a tape punch readout means, since it can employ either the tape punch or the telemetering switch or both as the readout means. Furthermore, since the telemetering switch is actuated completely independently of the tape punch, the present encoder apparatus is economical to operate since it can use the switch alone to monitor the counter readings during times of little change and can use the punch only to record the changes.

The shaft encoder apparatus of the present invention may be used as a liquid level recorder by connecting its input shaft to a float pulley, such as is employed to monitor changes in river levels. However, such shaft encoder apparatus may be employed as any other shaft encoder to measure any characteristic which rotates the input shaft of the encoder.

It is therefore one object of the present invention to provide a new and improved shaft encoder apparatus of simple, compact and inexpensive construction.

Another object of the invention is to provide an improved shaft encoder apparatus which is versatile and economical to operate, employing two independent readout means.

A further object of the invention is to provide an improved shaft encoder employing two readout means, such as a tape punch and telemetering switch, which are actuated by engagement with different portions of the same encoder cam.

An additional object of the present invention is to provide an improved encoder apparatus in which the transfer gears coupling adjacent stages of counter cams are vibrated during readout before such counter cams are locked in their readout position in order to provide an unambiguous counter reading.

BRIEF DESCRIPTION OF DRAWINGS

Additional objects and advantages will be apparent from the following detailed description thereof and from the attached drawings of which.

DESCRIPTION OF PREFERRED EMBODIMENT

Figures 1, 3:
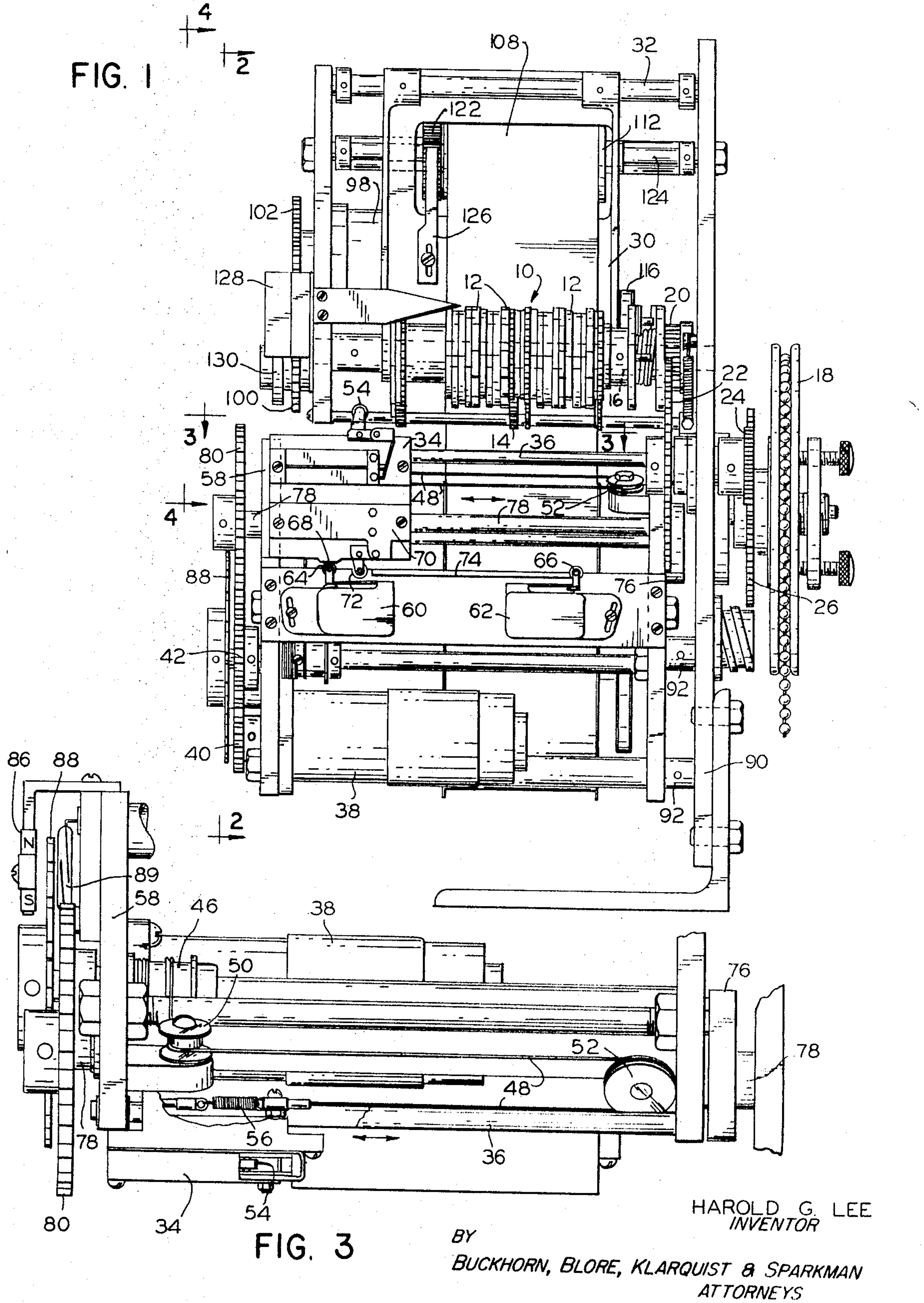
FIG. 1 is an elevation view of the front of the preferred embodiment of the present encoder apparatus with the housing removed.
FIG. 3 is a horizontal section view taken along the line 3–3 of FIG. 1 with parts broken away for clarity.
Figure 2:
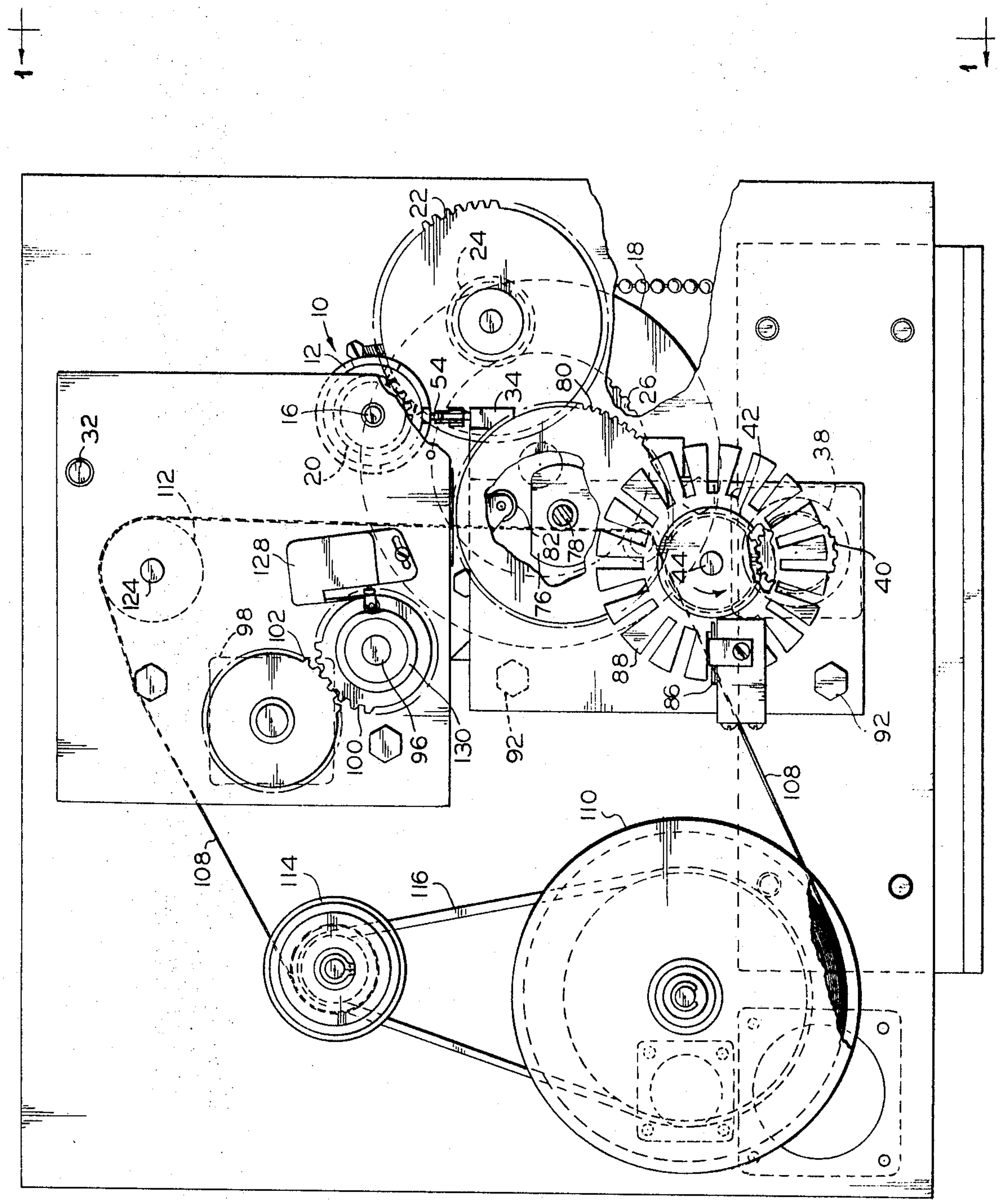
FIG. 2 is an elevation view of the left side of the apparatus of FIG. 1 with parts broken away for clarity.

As shown in FIGS. 1 and 2, the shaft encoder apparatus of the present invention includes a binary coded decimal counter 10 formed by a plurality of counter cams 12 having raised and recessed cam surfaces provided in a binary code on their edges. The counter cams are arranged in groups and adjacent cam groups are coupled together by transfer gears 14 to provide a decimal counter with each cam group providing one digit of the counter reading. The common shaft of the lowest digit cam group of counter 10 is coupled to an input shaft 16 which is connected to a float pulley 18 through gears 20, 22, 24 and 26. As a result the float pulley rotates the counter cams 12 in the manner set forth in my copending U.S. Pat. application 719,464 referred to previously.

Figure 4:
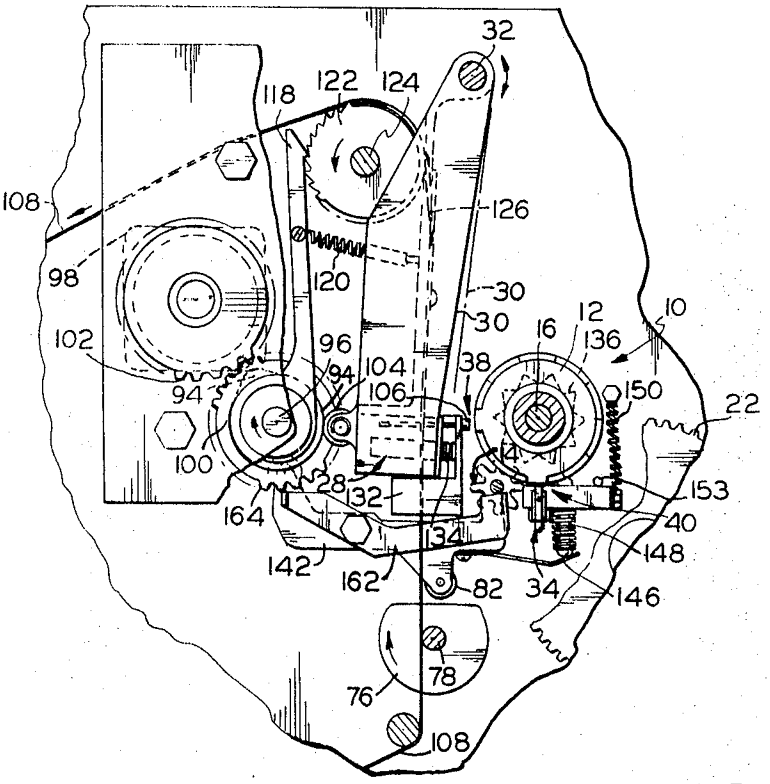
FIG. 4 is an elevation view of a portion of FIG. 1 taken along the line 4–4 with parts broken away for clarity to show the tape punch and telemetering switch readout means.

As shown in FIG. 4, the present encoder apparatus has two readout means including a tape punch 28 supported on a movable carriage 30 pivotally mounted on shaft 32, and a telemetering switch 34. The telemetering switch 34 is mounted for sliding movement along guide rod 36 as shown in FIG. 3. The tape punch 28 and the scan switch 34 are both operated by engagement with two different portions of the same counter cam at two different readout positions 38 and 40, respectively, which are displaced by an angle of approximately 90°. Thus, either the tape punch or the telemetering switch may be actuated as desired to provide a readout of the counter 10. The telemetering switch assembly may be eliminated if desired.

As shown in FIGS. 1, 2 and 3, the telemetering switch apparatus includes an electric motor 38 which is coupled by gears 40 and 42 to a shaft 44 on which a cable drum 46 is mounted. A cable 48 is attached at one end to the cable drum 46 and at its other end to the telemetering switch 34 after passing about pulleys 50 and 52. Thus, when the electric motor is actuated, cable drum 46 winds the cable 48 about such drum and causes the scan switch 34 to move to the right in FIGS. 1 and 3, thereby returning the scan switch to its initial position after scanning. Scanning movement of switch 34 to cause its cam follower actuator 54 to move from left to right across the counter cams 12, is caused by a coil spring 56 having one end attached to the scan carriage of switch 34 and its other end attached to the left side plate 58 of the telemetering assembly.

A pair of motor control switches 60 and 62 connected to motor 38 are mounted on the frame of the telemetering apparatus and positioned so that their cam follower actuators 64 and 66, respectively, are engaged by a cam projection 68 on the telemetering switch carriage. Switch 62 maintains the motor 38 running after it has been started and switch 60 reverses the motor when the carriage reaches the end of its longitudinal path. In addition, a transmission enabling switch 70 is provided on the scan carriage so that its cam follower actuator 72 engages a cam ridge 74 provided on the frame of the telemetering assembly to keep switch 70 closed during movement of such carriage. Switch 70 allows the output pulses of the scanning switch 34 to be transmitted only during left to right movement of the carriage when switch 34 produces a counter readout signal.

A lock cam 76 mounted on a shaft 78 is coupled to the electric motor 38 through gears 80, 42 and 40, as shown in FIG. 2, so that during electrical readout such lock cam engages a cam follower 82 which actuates a lock means for preventing movement of the counter cams 12 when the scanning switch 34 is taking a counter reading. This lock means is also operated during tape punch readout, as hereafter described with reference to FIG. 6.

The digitally coded pulses produced by the scan switch 34 are transmitted through a gate switch 84 for pulse shaping. The gate switch 84 may be a reed switch actuated by a permanent magnet 86 when a slotted gate disc 88 is rotated between such magnet and switch by shaft 44 so that the magnetic field is alternately shielded by the gate disc and transmitted through the slots in such gate disc. The slots and vane portions of the gate wheel 88 are all of the same size so that the output telemetering pulses transmitted through the gate switch 84 are of a uniform width. The entire telemetering switch assembly is bolted on the main frame 90 of the encoder apparatus by bolts 92 so that it can be removed if such telemetering is not desired and only the tape punch readout is employed.

It should be noted that rather than a single telemetering switch 34 which is scanned across all of the counter cams 12, it is possible to use a plurality of telemetering switches with a different switch associated with each counter cam 12 to provide a telemetering signal in the form of a plurality of parallel pulses, rather than the series pulses produced by the single switch 34. One such suitable parallel switch readout is shown in my copending U.S. Pat. application 719,464 referred to above.

Figures 5, 6:
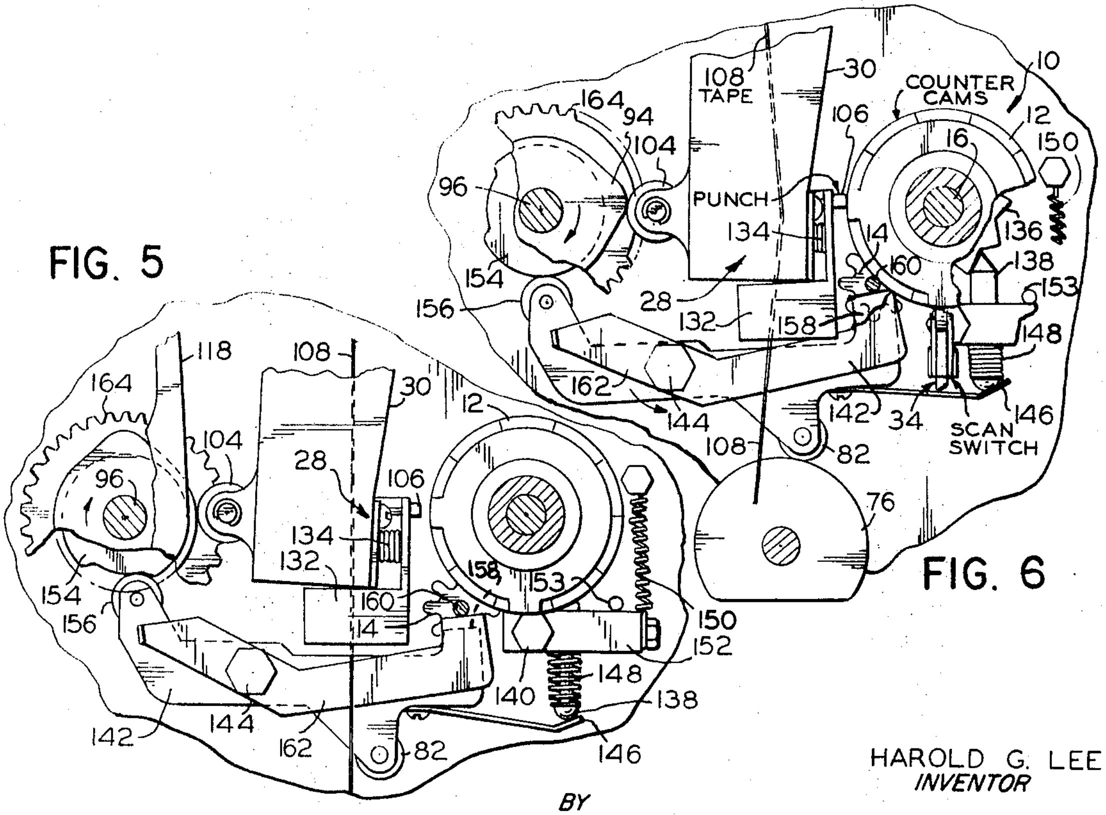
FIG. 5 is an enlarged view of a portion of FIG. 4 with parts broken away for clarity, showing a second position of the readout apparatus.
FIG. 6 is an enlarged view of a portion of FIG. 4 showing a third position of the readout apparatus.

The tape punch 28 readout means of the present invention is actuated by a punch cam 94 mounted on a shaft 96 which is rotated by an electric motor 98 through gears 100 and 102, as shown in FIGS. 4 to 6. The punch cam 94 engages a cam follower 104 attached to the carriage 30 to pivot such carriage counterclockwise about shaft 32 until a plurality of punch pins 106 engages the counter cam 12 at readout position 38. Paper tape 108 passes through the punch 28 and the punch pins 106 punch holes in such tape during readout if the punch pin engages a raised cam surface on the edge of the counter cams 12. If the punch pin 106 engages a recessed cam surface, no hole will be punched in the tape. Each of the counter cams 12 is provided with two sets of binary coded cam surfaces to provide identical counter readings at the two readout positions 38 and 40 displaced by an angle of 90°. Thus a punch tape readout is produced at readout position 38 while an electrical readout is produced at readout position 40.

The tape 108 is transmitted from a supply drum 110 through the punch 28 and over a toothed drive roller 112 to a takeup reel 114 as shown in FIG. 2. The supply reel 110 and the takeup reel 114 are interconnected by a coupling belt 116 and the tape is driven by a ratchet arm 118 which is mounted on an eccentric attached to the punch camshaft 96. The ratchet arm is biased by a coil spring 120 into engagement with a ratchet wheel 122 attached to the shaft 124 of tape drive roll 112 for counterclockwise rotation, as shown in FIG. 4. A pawl spring 126 also engages the ratchet wheel 122 to prevent its clockwise rotation during return of the ratchet arm and to properly index the tape drive roller.

A motor maintain switch 128 is connected to motor 98 for maintaining the operation of such motor until shaft 96 rotates 360°. The motor maintain switch 128 is actuated by a heart-shaped cam 130 attached to such shaft, as shown in FIG. 2.

The tape punch 28 is provided with a pin clearing member 132 which is biased away from the punch by a coil spring 134 so that such clearing member automatically retracts the punch pin 106 from the punch die when the carriage 30 pivots away from the counter pins. Thus after punching the clearing member 132 clears all of the punch pins into the extended position shown in FIG. 4.

The readout operation includes the steps of jittering the transfer gears 14, jamming such gears, locking the counter 10, and actuating the tape punch, as shown in FIGS. 4, 5 and 6. Before a counter reading is taken by the tape punch 28 or the scanning switch 34, the counter cams 12 are locked to prevent rotation of such counter cams during readout. The lock means includes a star wheel 136 attached to the input shaft 16 of the counter, and a locking pin 138 pivotally attached by a bolt 140 to the frame of the encoder apparatus. A lock actuating arm 142 pivotally mounted on bolt 144, is provided with a leaf spring extension 146 at one end thereof, which engages one end of the locking pin 138. The pointed end of the pin 138 is urged into one of the spaces between the teeth of the star wheel 136 when actuating arm 142 is pivoted in a counterclockwise direction from the unlocked position of FIG. 5 to the locked position of FIG. 6. In the unlocked position, the locking pin 138 is spring biased out of engagement with the star wheel 136 by a coil spring 148 surrounding such pin, and another spring 150 attached to the bracket 152 holding such pin to bias such bracket against a stop 153. A locking cam 154 mounted on shaft 96 for rotation therewith engages a cam follower roller 156 attached to the other end of the lock actuating arm 142 to pivot such actuating arm. Thus, when locking cam 154 rotates clockwise from the position of FIG. 5 to the position of FIG. 6, cam follower roller 156 moves out of the cam recess and pivots actuating arm 142 in a counterclockwise direction to operate the lock. In addition, the actuating arm also moves another end portion 158 of such arm into contact with a common shaft 160 on which the transfer gears 14 are mounted, to jam such transfer gears closely into engagement with the gears attached to the locked shafts of the counter cams.

In addition, a jitter means is employed during punched tape readout to vibrate the transfer gears 14 immediately prior to lockup and jamming in order to reduce static friction and give a more accurate counter reading. This is accomplished by vibrating the common shaft 160 with a jitter arm 162 which is also pivotally mounted on bolt 144 with its other end in engagement with a serrated jitter cam 164, as shown in FIGS. 4 and 5. The jitter cam 164 vibrates the jitter arm 162 by pivoting such arm back and forth through a small arc about the axis of bolt 144 for about 45° rotation of shaft 96 for each tape punch readout. This causes the transfer gear shaft 160 to vibrate the counter cams into an unambiguous counter reading immediately before such counter cams are locked and the tape punch is actuated to record such reading. The jitter angle is determined by the length of the recess in locking cam 154 because jitter stops when jamming of shaft 160 begins.

As stated previously, another cam follower 82 is provided on the actuating arm 142 of the locking means so that the telemetering switch readout also locks the counter by means of cam 76 engaging cam follower 82. This prevents rotation of the counter cams during movement of the telemetering switch across such cams to produce electrical readout signal. The result is completely independent operation of the telemetering switch readout and the punch tape readout for the shaft encoder of the present invention.

It will be obvious to those having ordinary skill in the art that many changes may be made in the above-described details of the preferred embodiment of the present invention without departing from the spirit of the invention. Therefore the scope of the invention should only be determined by the following claims.

I claim:

1. Shaft encoder apparatus comprising:

an input shaft;

counter means including a plurality of rotatable counter cams coupled to said input shaft, said counter cams having raised and recessed cam surface portions on their edges arranged in a digital code to provide a counter reading which indicates the rotational position of said input shaft at a readout position on said counter means;

first readout means including a first actuator means movably supported for engaging the cam portions of the counter cams at a first readout position provided by a first set of said cam portions to produce a first readout corresponding to said counter reading;

second readout means including a second actuator means movably supported for engaging the cam portions of the counter cams at a second readout position provided by a second set of said cam portions to produce a second readout of said counter reading, said second readout position being angularly displaced from said first readout position but providing the same counter readings; and control means for independently operating said first and second readout means by selectively moving said first actuator and said second actuator into and out of engagement with said counter cams.

2. Encoder apparatus in accordance with claim 1 in which the first readout means is of a different type than said second readout means.

3. Encoder apparatus in accordance with claim 2 in which the first readout means is a switch means and the second readout means includes a tape punch having punch pins serving as said second actuator means.

4. Encoder apparatus in accordance with claim 3 in which the first readout means includes a cam actuated scanning switch operated by said first actuator and carriage means for moving said switch longitudinally along the axis of the counter cams so that the first actuator moves successively across the counter cams to produce a series readout signal.

5. Encoder apparatus in accordance with claim 2 in which the counter cams each have two angularly displaced sets of binary coded cam portions which provide two identical counter readings at the first and second readout positions which are displaced from each other by the same angle as said two sets of cam portions.

6. Encoder apparatus in accordance with claim 1 in which the counter means is a decimal counter and the counter cams are arranged in groups with each group producing a different digit of the counter reading, and which also includes a plurality of transfer gears coupling adjacent groups of cams together, lock means actuated by the first and second readout means for locking the counter cams against rotation when the first and second readout means are taking counter readings, and jitter means for vibrating the transfer gears in response to actuation of the lock means by at least one readout means so that the counter cams are vibrated into an unambiguous counter reading before locking.

7. Encoder apparatus in accordance with claim 6 in which the transfer gears are mounted on a common shaft which is vibrated by the jitter means, said jitter means including jitter arm pivotally supported intermediate its ends so that one end engages a serrated jitter cam and its other end engages the common shaft to vibrate said common shaft when the jitter cam is rotated.

8. Encoder apparatus in accordance with claim 7 which also includes jam means for preventing vibration of the common shaft when the counter cams are locked.

9. Encoder apparatus in accordance with claim 8 in which the jam means and the lock means are operated by a common actuating arm pivotally supported intermediate its ends on the jitter arm pivot with one end having a cam follower engaging an actuator cam fixed to the same drive shaft as the jitter cam and its other end having a first portion which engages the common shaft and a second portion which engages the lock means, said drive shaft being selectively rotated to operate one of the readout means after the counter cams are locked.

10. Encoder apparatus in accordance with claim 9 in which the drive shaft is connected to the output of a motor and the recorder means of the second readout means is a tape punch having punch pins serving as the second actuator means, said punch having a cam follower actuator engaging a punch cam on said drive shaft to operate the punch.

11. Encoder apparatus in accordance with claim 9 in which the common actuating arm is provided with a second cam follower engaging a second actuator cam mounted on a second shaft coupled to a different readout means than that operated by the drive shaft.

12. Encoder apparatus in accordance with claim 11 in which the drive shaft operates the second readout means which is a tape punch and the second shaft is coupled to the first readout means which is a scanning switch.

13. Shaft encoder apparatus comprising:

an input shaft;

counter means including a plurality of groups of rotatable counter cams coupled to said input shaft with adjacent groups of cams coupled together by transfer gears, said counter cams having raised and recessed cam surface portions arranged in a digital code to provide a counter reading at a readout position on the counter means which indicates the rotational position of the input shaft;

readout means for engaging the cam portions of said counter cams at said readout position to take said counter reading;

lock means actuated by the readout means for locking the counter cams against rotation when a counter reading is being taken; and jitter means for vibrating the transfer gears in response to actuation of the lock means by the readout means to vibrate the counter cams into an unambiguous counter reading before they are locked.

14. Encoder apparatus in accordance with claim 13 in which the transfer gears are mounted on a common shaft which is vibrated by the jitter means, said jitter means including a jitter arm pivotally supported intermediate its ends so that one end engages a serrated jitter cam and its other end engages said common shaft.